(12) United States Patent
Ojiri et al.

(10) Patent No.: US 7,485,814 B2
(45) Date of Patent: Feb. 3, 2009

(54) ELECTROMAGNETIC WAVE SHIELDING FILTER

(75) Inventors: Tetsuya Ojiri, Tokyo (JP); Fumihiro Arakawa, Tokyo (JP); Yukihiro Kyoden, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 58 days.

(21) Appl. No.: 11/794,114

(22) PCT Filed: Feb. 24, 2006

(86) PCT No.: PCT/JP2006/303378

§ 371 (c)(1),
(2), (4) Date: Jun. 25, 2007

(87) PCT Pub. No.: WO2006/090820

PCT Pub. Date: Aug. 31, 2006

(65) Prior Publication Data

US 2007/0291463 A1    Dec. 20, 2007

(30) Foreign Application Priority Data

Feb. 25, 2005  (JP) .............................. 2005-050144

(51) Int. Cl.
*H05K 9/00* (2006.01)
(52) U.S. Cl. ........................ 174/389; 174/392
(58) Field of Classification Search ............ 174/389, 174/392; 361/816, 818, 800; 313/313; 430/321
See application file for complete search history.

(56) References Cited

U.S. PATENT DOCUMENTS

| | | | | |
|---|---|---|---|---|
| 6,621,003 | B2 * | 9/2003 | Yoshida et al. | 174/389 |
| 6,686,536 | B2 * | 2/2004 | Tone et al. | 174/389 |
| 7,037,594 | B2 * | 5/2006 | Kojima et al. | 428/601 |
| 7,255,980 | B2 * | 8/2007 | Hwang et al. | 430/321 |
| 7,375,292 | B2 * | 5/2008 | Naito et al. | 174/389 |
| 2003/0007341 | A1 * | 1/2003 | Shimamura et al. | 361/816 |
| 2003/0013048 | A1 * | 1/2003 | Gilson | 430/321 |
| 2004/0000416 | A1 * | 1/2004 | Hou | 174/35 MS |

FOREIGN PATENT DOCUMENTS

| | | |
|---|---|---|
| JP | A 2000-286594 | 10/2000 |
| JP | A 2002-009484 | 1/2002 |
| JP | A 2002-353684 | 12/2002 |
| JP | A 2003-318596 | 11/2003 |

* cited by examiner

*Primary Examiner*—Hung V Ngo
(74) *Attorney, Agent, or Firm*—Oliff & Berridge, PLC

(57) ABSTRACT

An electromagnetic wave shielding filter 10 includes a meshed layer, wherein at least one of the front and back surfaces of the meshed layer is subjected to a blackening treatment to be a blackened face having micro-irregularities. The shape of the micro-irregularities is adjusted to have a probability density curve with a peak point being convex upward wherein the probability density curve is defined as a curve depicted in a graph in which the change of height from the peak value Rp to the bottom value Rv of the deepest valley is shown as the horizontal axis while the probability density expressing the distribution of height is shown as the vertical axis. Also, in the probability density curve, a horizontal tangent can be drawn at its peak point.

8 Claims, 4 Drawing Sheets

# ELECTROMAGNETIC WAVE SHIELDING FILTER

BACKGROUND OF THE INVENTION

1. Field of the Invention

The present invention relates to an electromagnetic wave shielding filter with an optical transparency.

2. Background Art

An electromagnetic wave shielding filter to be disposed on the front surface of a display has been known for shielding electromagnetic waves generated from various displays, such as PDPs (Plasma Display Panels), CRTs (Cathode Ray Tube or Braun Tube)) and the like. For the electromagnetic wave shielding filters for use in such applications, both the electromagnetic shielding ability and the optical transparency are required. To address this challenge, there has been known an electromagnetic wave shielding filter, wherein a transparent material formed of a resin film or glass and having electrically insulating properties is used as a base material, and an electrically conductive meshed layer formed by etching a metal foil or metal plating is provided on the transparent base material.

As described above, in the case of forming the meshed layer utilizing a copper foil or copper plating, since metallic luster which causes reflection of unnecessary light such as natural light degrades the contrast of perspective images in a bright room, the surface of the meshed layer is commonly covered with a blackened layer to have an appearance of a blackened face, thereby to preventing light reflection (Patent Document 1 and Patent Document 2). In this case, it is considered preferable to prescribe the surface roughness of the blackened face formed by a blackening treatment because it has a higher degree of blackness and can thus enhance the antireflection ability. For example, a reference which prescribes the surface roughness Ra in a range of 0.10 to 1.00 μm (see, Patent Document 1) and another reference prescribing the arithmetically averaged surface roughness Ra, as provided in JIS B0601, in a range of 0.02 to 1.00 μm (see, Patent Document 2) are known.

Patent Document 1: TOKUKAT No. 2000-286594, KOHO ([0022]-[0025])

Patent Document 2: TOKUKAI No. 2003-318596, KOHO ([0030])

In general, it is uncommon that the electromagnetic wave shielding filter is constructed such that the meshed layer is directly exposed to air. Namely, a transparent resin layer is provided to cover the meshed layer for protection and additional optical filter functions. Therefore, the blackened face on the side of the transparent resin layer of the meshed layer will be in the so-called wetted state with the transparent resin layer due to close lamination of the transparent resin layer thereon. Accordingly, such a blackened face will have an appearance (herein, this appearance will be referred to as "a wetted color" as is seen when a surface is wetted with a liquid) different from the appearance when it is directly exposed to air. The phenomenon exhibiting such a wetted color is the same also in the case where the blackened face is provided on the transparent base material side of the meshed layer, i.e., the case where the meshed layer having the blackened face on its transparent base material side is laminated on the transparent base material.

Accordingly, in such a usually employed configuration, the appearance of the blackened face is directly influenced by the wetted color. Therefore, in some instances, the employment of only the prescription of the arithmetically averaged surface roughness Ra as described above can not be enough for estimating the degree of blackness of the blackened face.

SUMMARY OF THE INVENTION

It is an object of the present invention to provide an electromagnetic wave shielding filter having a blackened face which is excellent in the antireflection property.

The present invention is an electromagnetic wave shielding filter, comprising: a meshed layer formed of a meshed electrically conductive material; wherein a blackened face having micro-irregularities is formed on at least one face of the meshed layer; and wherein the shape of the micro-irregularities of the blackened face is adjusted to have a probability density curve in which a peak point is convex upward and a horizontal tangent can be drawn at the peak point, the probability density curve being defined as a curve depicted in a graph in which the change of height from the peak value Rp to the bottom value Rv of the micro-irregularities is shown as the horizontal axis while the probability density expressing the distribution of height is shown as the vertical axis.

The present invention is the electromagnetic wave shielding filter, wherein the meshed layer is supported by a transparent base material.

The present invention is the electromagnetic wave shielding filter, wherein a transparent resin layer is provided on the meshed layer.

The present invention is the electromagnetic wave shielding filter, wherein the blackened face is formed on the face of the meshed layer on the side of the transparent base material as well as on the face thereof on the side opposite to the transparent base material.

The present invention is the electromagnetic wave shielding filter, wherein the blackened face is also formed on one or both side faces of the meshed layer.

The present invention is the electromagnetic wave shielding filter, wherein the probability density curve for the micro-irregularities has a height P at the peak point in the vicinity of an intermediate height M between Rp and Rv.

The present invention is the electromagnetic wave shielding filter, wherein the probability density curve for the micro-irregularities satisfies (|P−M|/Rp−Rv)×100≦12.

The present invention is the electromagnetic wave shielding filter, wherein the averaged surface roughness Ra of the micro-irregularities is in a rage of 0.10 to 1.00 μm.

According to the construction as described above, the distribution of height of the micro-irregularities in the blackened face is not centered at a certain point and has an adequate spread. Therefore, capture of light due to the face including the micro-irregularities can be enhanced, thus providing a blackened face significantly excellent in the antireflection property even in a state of exhibiting a wetted color.

Even in the case where the mechanical strength of the meshed layer is insufficient itself, the transparent base material serves as a supporting member of the meshed layer, increasing the mechanical strength for the whole body of the electromagnetic wave shielding filter, thus facilitating the handling. Also in the case where the surface on the transparent base material side of the meshed layer is treated to be a blackened face having desired micro-irregularities, an excellent antireflection property can be achieved even in a portion of the blackened face exhibiting a wetted color by contacting the transparent base material itself or a transparent adhesive or the like for adhering the transparent base material to the meshed layer with the blackened face.

The transparent resin layer serves to protect the blackened face of the meshed layer under the transparent resin layer from corrosion or damage. In addition, while the blackened face of the meshed layer under the transparent resin layer exhibits a wetted color due to contact with the transparent resin layer, the antireflection property may be excellent even in the portion of the blackened face exhibiting the wetted color.

(1) According to the electromagnetic wave shielding filter of the present invention, a blackened face which is excellent in the antireflection property even in a state of exhibiting a wetted color can be obtained.

(2) Further, in the construction where the meshed layer is supported by an electrically insulating transparent base material, the mechanical strength can be enhanced, thus improving the handling property.

(3) Additionally, in the construction where the transparent resin layer is laminated on the blackened face of the meshed layer, the blackened face can be protected, and the degree of blackness of a portion of the blackened face in a state exhibiting a wetted color due to the transparent resin layer can be enhanced.

DETAILED DESCRIPTION OF THE INVENTION

Hereinafter, the best mode for carrying out the present invention will be described with reference to the drawings.

(General Description of the Drawings)

Figure 1:
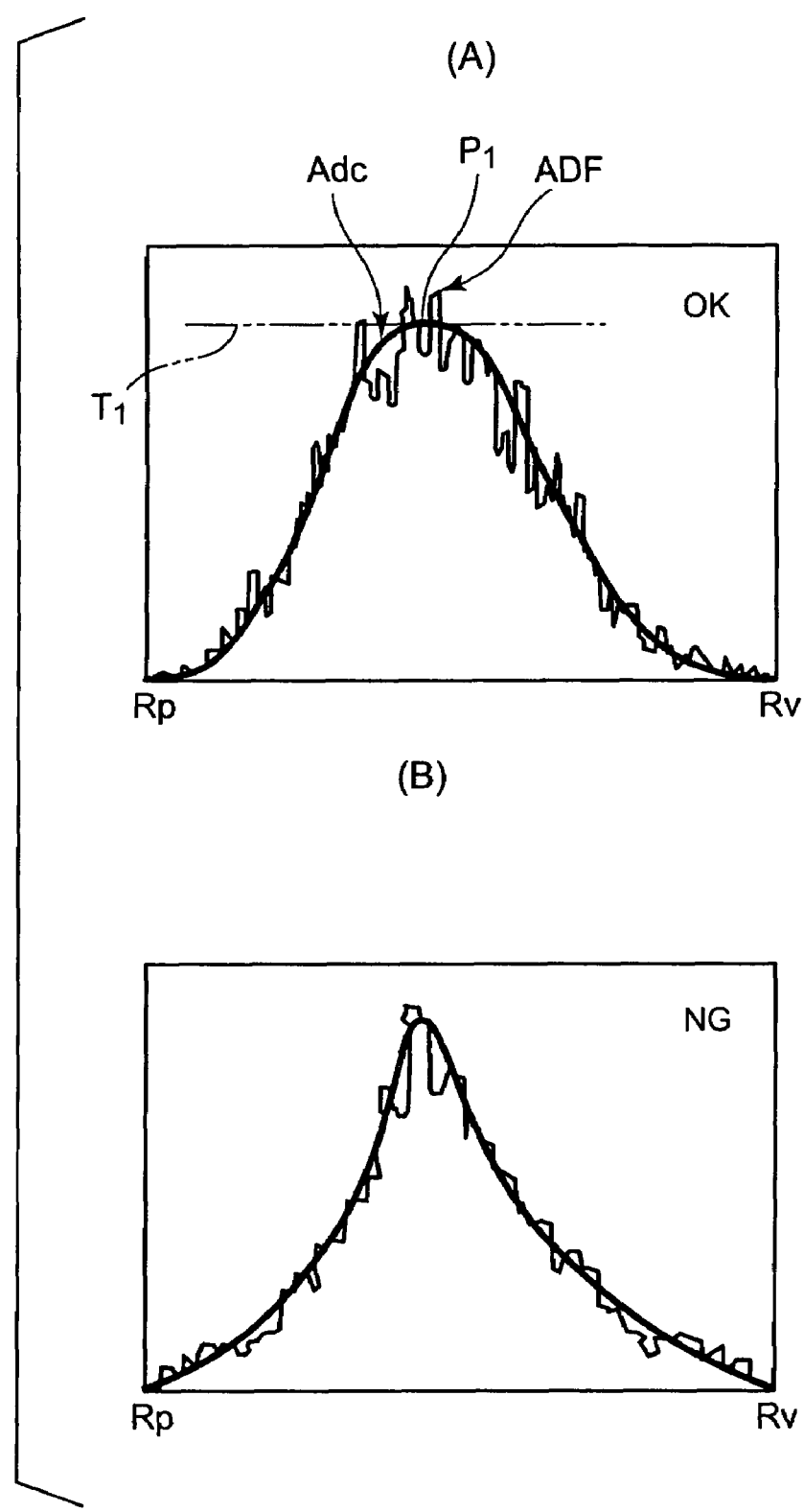
FIG. 1(A) shows a probability density curve Adc obtained by smoothing a probability density function ADF according to the present invention.
FIG. 1(B) shows a probability density curve Adc and a probability density function ADF as a comparative example.

FIG. 1 illustrates a probability density function ADF as a contour curve and a curve (probability density curve Adc) obtained by smoothing the probability density function ADF, wherein FIG. 1(A) shows shapes of the respective curves corresponding to the present invention, while FIG. 1(B) shows shapes of the respective curves as a comparative example.

Figure 2:
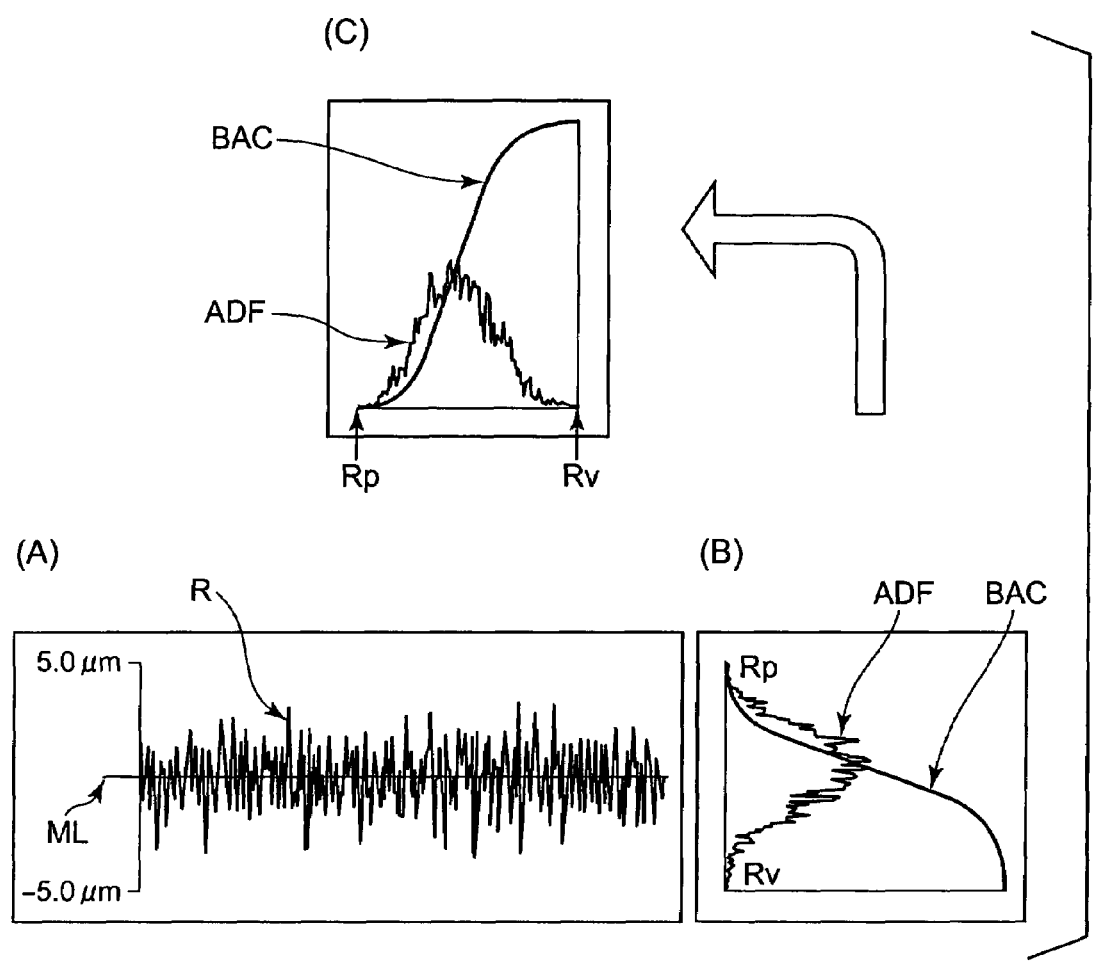
FIG. 2(A) is a graph showing a contour curve (roughness curve R)
FIG. 2(B) is a graph showing a probability density function ADF and a load curve BAC.
FIG. 2(C) is a graph obtained by rotating FIG. 2(B) such that the probability density will be the vertical axis.

FIG. 2 illustrates a contour curve (roughness curve R), a probability density function ADF of the roughness curve obtained thereby, a load curve BAC (accumulated curve) of the roughness curve, wherein FIG. 2(A) is a graph of the contour curve, and FIGS. 2(B) and 2(C) are graphs of the probability density function ADF and the load curve BAC, and wherein FIG. 2(C) is a graph obtained by rotating FIG. 2(B) counterclockwise by 90 degrees, such that the probability density of the probability density function ADF is expressed as the vertical axis above the horizontal axis.

Figure 3:
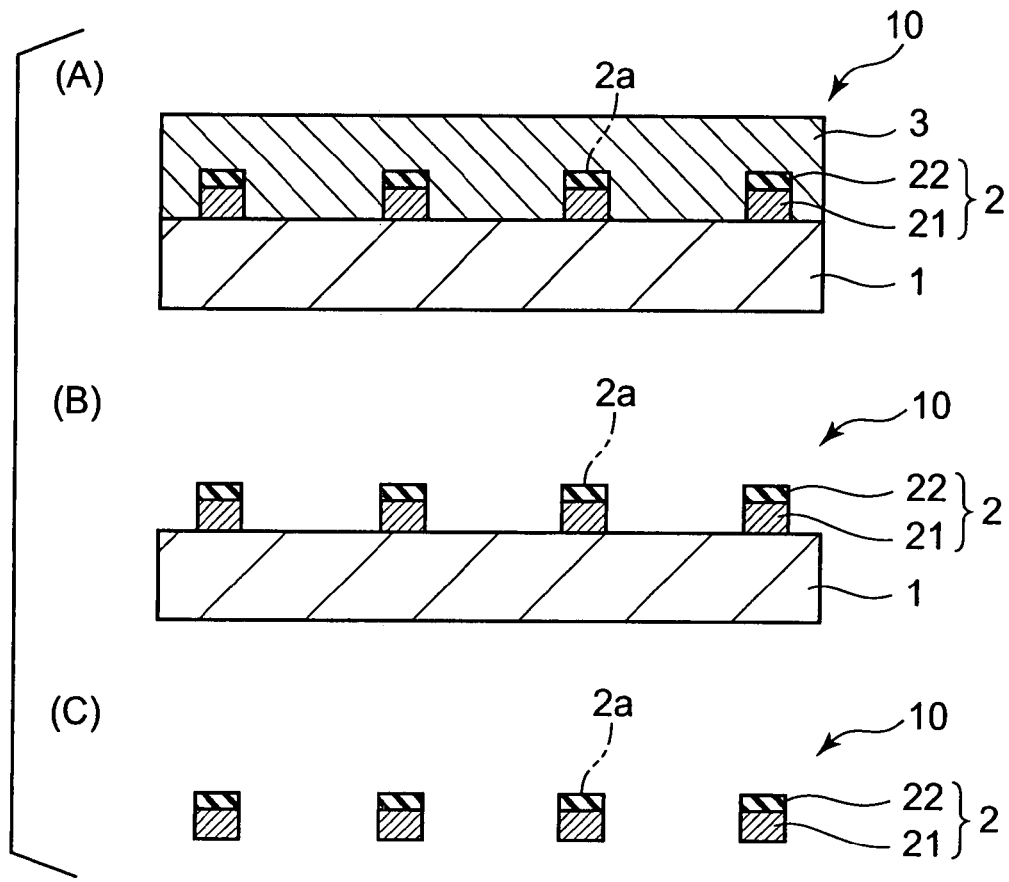
FIGS. 3(A), 3(B) and 3(C) show constructions of layers in an electromagnetic wave shielding filter, respectively.

FIG. 3 illustrates three aspects, in cross sections, of a layered construction of the electromagnetic wave shielding filter, wherein FIG. 3(A) shows a construction including a transparent base material 1 and a transparent resin layer 3, FIG. 3(B) shows a construction including the transparent base material 1, and FIG. 3(C) shows a construction including only a meshed layer 2.

Figure 4:
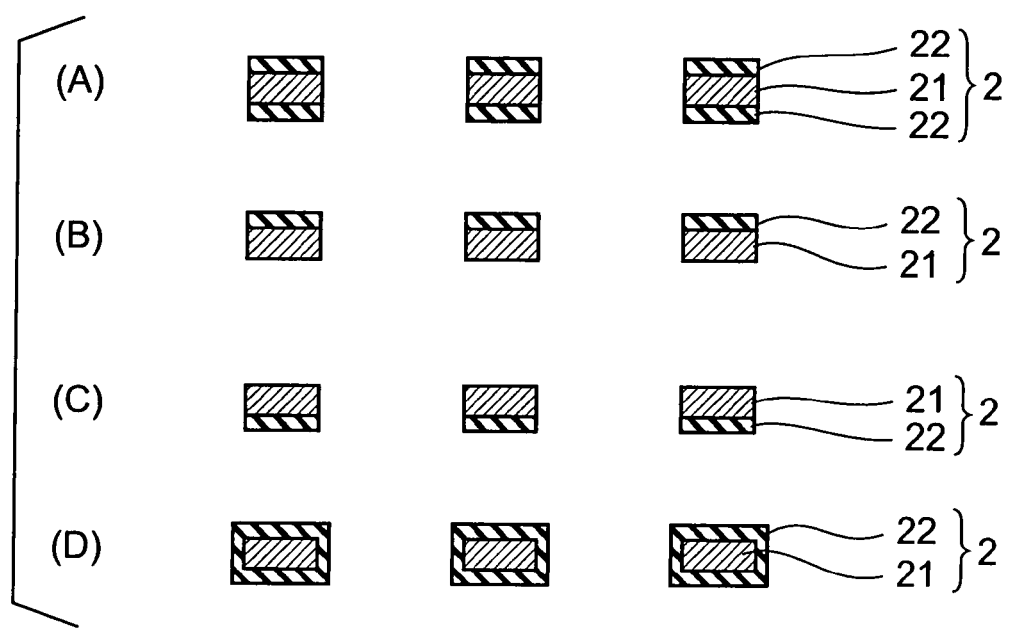
FIGS. 4(A), 4(B), 4(C) and 4(D) are cross sections showing blackened layers in a meshed layer, respectively.

FIG. 4 illustrates various aspects, in cross sections, of combinations of blackened layers in the meshed layer, wherein FIG. 4(A) shows a case where the blackened layers are provided on both the front and back surfaces, FIG. 4(B) shows a case of providing the blackened layers only on the front surface, FIG. 4(C) shows a case of providing the blackened layers only on the back surface, and FIG. 4(D) shows a case where the blackened layers are provided on both the front and back surfaces as well as on both side faces.

Figure 5:
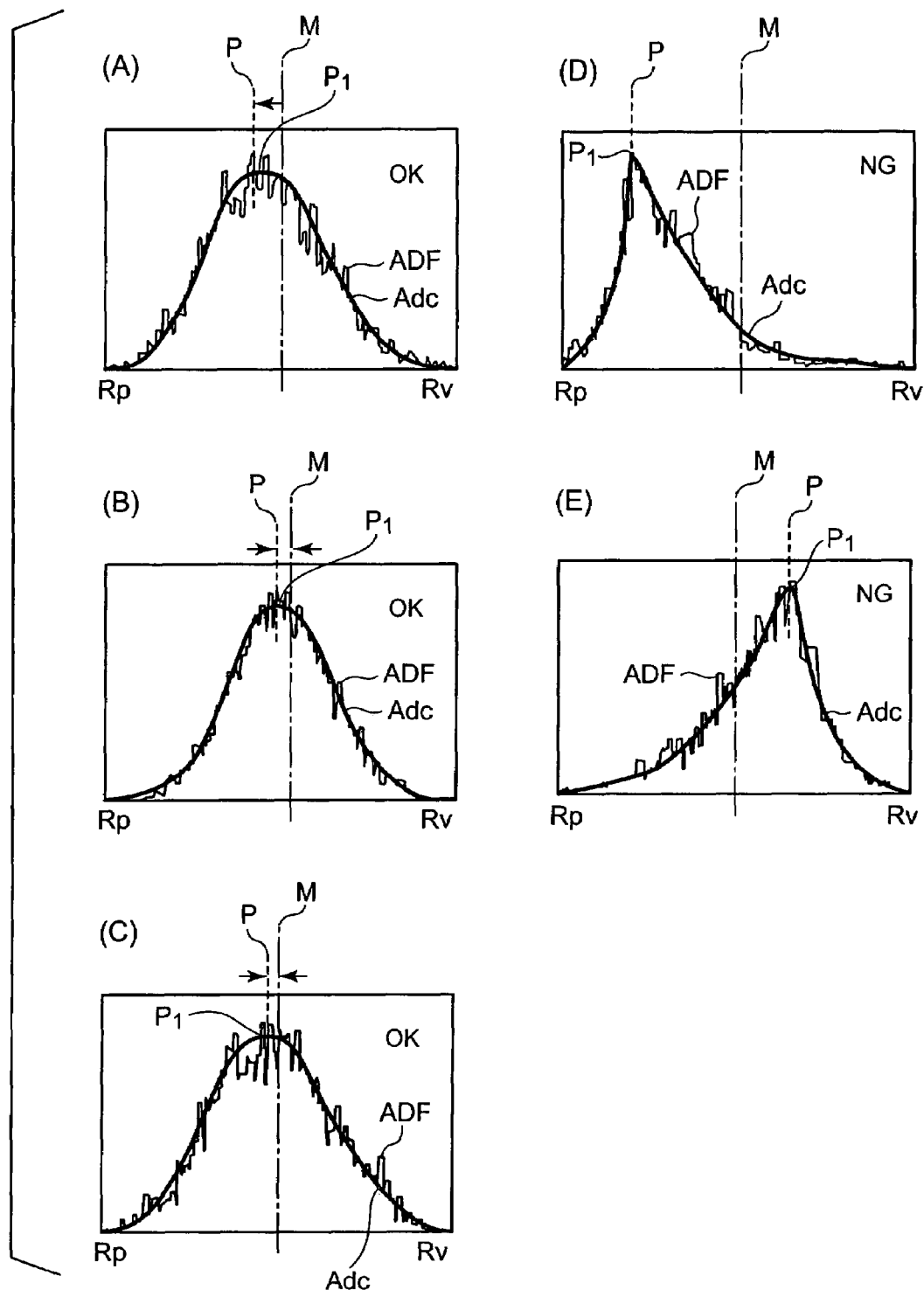
FIGS. 5(A), 5(B) and 5(C) are graphs showing probability density curves according to the present invention.
FIGS. 5(D) and 5(E) are graphs showing probability density curves of comparative examples.

FIG. 5 illustrates graphs of actual probability density functions and probability density curves of the present examples and comparative examples, wherein FIGS. 5(A) to 5(C) show examples of the present invention, and FIGS. 5(D) and 5(E) show comparative examples, respectively.

(Brief Summary)

In the case of the electromagnetic wave shielding filter of the present invention, concerning the surface roughness defined by micro-irregularities in the blackened face of the blackened layer of the meshed layer having been subjected to a blackening treatment, the shape in the vicinity of the peak of the probability density in the probability density curve to be obtained by smoothing the probability density function of the contour curve defined as the roughness curve is not so sharply pointed as the curve shown in FIG. 1(B), but has a shape of a curve which is convex upward (in the direction along which the probability density increases) as shown in FIG. 1(A). Thus, such blackened face can provided a better antireflection effect.

An electromagnetic wave shielding filter 10 according to the present invention comprises an electrically insulating transparent base material (electrically insulating transparent substrate) 1, and a meshed layer 2 provided on the transparent base material 1 and formed of an electrically conductive material (FIG. 3(A)). Of these components, the mashed layer 2 includes a meshed conductive layer 21, and a blackened layer 22 provided on the meshed conductive layer 21, wherein the blackened layer 22 including a blackened face 22. In FIG. 3(A), the blackened face 22 of the meshed layer 2 is positioned opposite the transparent base material 1.

Also, as shown in FIG. 3(A), above the meshed layer 2, a transparent resin layer 3 is provided covering the meshed layer 2.

The transparent resin layer 3 is not necessarily required to be provided (FIG. 3(B)). While the transparent base material 1 is used for supporting the meshed layer 2, it is not necessarily required to be employed (FIG. 3(C)).

Optionally, the electromagnetic wave shielding filter 10 may comprise other layers as needed. For example, as in the case where the electromagnetic wave shielding filter 10 is covered with a rustproof layer (anti-corrosive layer) because of some fear that the meshed layer 2 will get rusty, a variety of publicly known layers or treatments can be applied to the filter 10 without departing from the spirit and scope of the present invention.

The terms, "front surface", "front side", "back surface" and "back side", as used herein, have meanings as follows, respectively. In the case where the meshed layer 2 is formed on the transparent base material 1, the "front surface" means the face which faces in the same direction (i.e., the upper face as seen in the drawing) as the side (referred to as "front side") on which the meshed layer 2 is provided to the transparent base material 1. The "front side" means the same side on which the meshed layer 2 is provided (the side facing upward as seen in the drawing). The "back surface" means the face opposite to the front surface (the lower face as seen in the drawing) and the "back side" means the side opposite to the front side (the side facing downward as seen in the drawing). In the case where the electromagnetic wave shielding filter 10 is composed of a meshed layer alone, there will be no discrimination between the front surface and the back surface. However, for convenience, the upper face as seen in the drawing is referred to as the front surface (surface).

When applied to a display or the like, the face on the observer side is not necessarily considered as the "front face" defined in the present invention, in some cases, it may also be the "back face".

Now, the electromagnetic wave shielding filter according to the present invention will be described, in succession, where the transparent base material will be explained first.

(Transparent Base Material)

The electrically insulating transparent base material (electrically insulating transparent substrate) 1 is used for reinforcing the meshed layer which has generally low mechanical strength. Accordingly, if satisfying adequate mechanical strength and optical transparency as well as having proper heat resistance, insulating ability and the like, any material can be selected for the transparent base material 1. As the material for the transparent base material 1, resin plates, resin sheets (or films), glass plates or the like can be mentioned. The term "electrically insulating", as used herein, means an electrically insulating ability such that an effective electromagnetic wave shielding ability can not be expected by the transparent base material alone. This is to be postulated in the present invention. Expressed in the surface resistance, this insulating ability corresponds to a value of approximately $10^2 \Omega/\square$ or greater. Since any base materials formed of usual transparent resins or glass have surface resistance of $10^2 \Omega/\square$ or greater, they can be applied to the electrically insulating transparent material as defined herein.

As the transparent resins used as the resin plates or resin sheets, for example, polyester resins, such as polyethylene terephthalates, polybutylene terephthalates, polyethylene naphthalates, terephthalic acid-isophthalic acid-ethylene glycol copolymers and terephthalic acid-cyclohexanedimethanol-ethylene glycol copolymers; polyamide resins, such as nylon 6; polyolefin resins, such as polypropylenes and polymethylpentenes; acryl resins, such as polymethylmethacrylates; styrene resins, such as polystyrenes and styrene-acrylonitrile copolymers; cellulose resins, such as triacetyl celluloses; imide resins; and polycarbonate resins can be mentioned.

These resins, when used as the resin material, may be used alone or in a mixture (including polymer alloys) containing plural types of resins. In the layered products, the resins can be used in a monolayer form or a laminated structure composed of two layers or more. In the case of the resin sheet, a monoaxially or biaxially oriented sheet is preferred in respect of the mechanical strength.

To the resin sheet, as needed or optionally, an ultraviolet ray absorbent, infrared ray absorbent, filler, plasticizer or antistatic agent may be added.

As the glass material used for the glass plate, quarts glass, borosilicate glass, soda lime glass or the like can be mentioned. Preferably, this material has a relatively low coefficient of thermal expansion, and is excellent in the dimensional stability and workability at a high temperature heating treatment, and this material can include an alkali-free glass which does not contain alkali ingredients, and can also be used as an electrode substrate such as a front substrate of a display.

The thickness of the transparent base material 1 is not limited in particular as good as it is well applicable to use. However, in the case being formed of the transparent resin, the thickness is usually about 12 to 1000 μm, preferably 50 to 700 μm, and more preferably 100 to 500 μm. To the contrary, in the case where the transparent base material is formed of the glass, the thickness is preferably about 1 to 5 mm. In either case, if the thickness is below the aforementioned range, the mechanical strength will be insufficient, causing a warp, sag or rupture, but if the thickness is above the range, the properties will become excessive, thus being wasteful in the cost and difficult to produce a slim display.

As the transparent base material 1, a sheet (or film) or plate formed of the aforementioned inorganic materials and organic materials or the like may be used, and the transparent base material can also be used as a front face substrate which is an element for constituting a display body comprising the front face substrate and a back face substrate. In the case of employing an electromagnetic shielding filter as a front face filter to be placed in front of the front face substrate, a sheet is preferable to a plate in respect of the thinness and light weight. Of course, a resin sheet is more practicable than a glass plate because it will not be broken.

In respect of capability of improving the productivity for continuously producing the electromagnetic wave shielding filters, it is preferred that the transparent base material is handled in a form of a continuous and belt-like sheet (or web).

In this respect, it is preferred to use a resin sheet as the transparent base material 1. Among resin sheets, polyester-type resin sheets such as polyethylene terephthalates and polyethylene naphthalates and cellulose-type resin sheets are preferable in respect of the transparency, heat resistance and cost, with polyethylene terephthalate sheets being the most preferable. A higher transparency is more advantageous, and the transmittance of visible light is preferably 80% or higher.

Optionally, the transparent base material 1 may be subjected to a publicly known adhesion facilitating treatment, such as a corona discharge, plasma treatment, ozone treatment, flaming treatment, primer coating, preheating, dust removing, vapor deposition, alkali treatment or formation of an anchoring layer (for the vapor deposition).

The transparent base material 1 may be colored with a dye. Such coloring may serve to absorb near infrared rays or neon light, adjust color, or provide antireflection of natural light. For example, various publicly known dyes, such as near infrared ray absorbents, neon light absorbents, color adjusting dyes and dyes for antireflection of natural light, can be added to the resin transparent base material.

(Meshed Layer)

The meshed layer 2 serves as a layer for effecting electromagnetic wave shielding and is not optically transparent in nature. However, by forming openings in a mesh form in a plane view, optical transparency to the layer can be obtained. In addition, the meshed layer 2 has a blackened layer including a blackened face which is formed by subjecting at least one of the front and back surfaces to a blackening treatment where micro-irregularities on the blackened face has a particular shape. In this treatment, a blackened layer including a blackened face 22 is formed by subjecting a surface to be treated of the meshed electrically conductive layer 21 (which is formed of a metal foil as a main body of the meshed layer) to a blackening treatment, so as to use the surface of the blackened layer 22 as the aforementioned blackened face.

Other than the blackened layer 22, additional layers such as a rustproof layer (anti-corrosive layer) as described below may be provided as needed for maintaining the integrity of the meshed shape which is a structural feature of the meshed layer.

(Meshed Layer: Blackening Treatment)

The blackening treatment serves to prevent light reflection on the surface of the meshed layer 2. The blackened layer formed by a blackening treatment prevents lowering of the degree of blackness (blackening degree) of perspective images due to reflection of natural light on the surface of the meshed layer 2, thereby enhancing the degree of blackness and improving the contrast of the perspective images in a bright room. While it is preferred to provide the blackened face to all the surfaces of the meshed layer, in the embodiments of this invention, at least one of the front and back surfaces is subjected to the blackening treatment.

The blackened face 22 may be a surface of the mono-layered meshed layer 2 itself. Namely, if the meshed layer is mono-layered and has a black colored surface as well as micro-irregularities, it will no longer be needed to apply an additional blackening treatment to the surface. Even in the case of not requiring the blackening treatment, if it is possible to form a surface which is black colored and has desired micro-irregularities, such a surface can resultantly exhibit the same desired properties as described above. Therefore, this surface can also be considered as "the blackened face" in the present invention.

Usually, the electrically conductive layer 21 formed of a metal or the like is employed for the meshed layer 2 because of the electric conductivity necessary for the electromagnetic wave shielding ability. Such electrically conductive layer 21 will not often have a blackened face because the color of its surface is a metal color or the like even if micro-irregularities exist on the surface. Accordingly, in such a case, a blackening treatment for forming a blackened layer as described below should be applied to ensure forming of the blackened face on the surface of the formed blackened layer 22. In order to provide the blackened layer on the surface, other than additionally forming the blackened layer by plating or the like means on a layer (an electrically conductive layer such as the meshed electrically conductive layer) constituting the surface, the layer itself may be changed into the blackened layer from its surface to the inside by etching or oxidation. Accordingly, the meshed layer 2 usually has the meshed electrically conductive layer 21 adapted to provide the electromagnetic wave shielding ability due to its electric conductivity, as well as, the blackened layer 22 provided on at least one of the front and back surfaces thereof (see FIG. 4).

Accordingly, with respect to the object to be blackened with the blackened layer 22 to have desired micro-irregularities, the blackened layer 22 can be provided on both the front and back surfaces of the meshed layer 2 (FIG. 4(A)), only on its front surface (FIG. 4(B)), only on its back surface (FIG. 4(C)), only on its front surface and a side face(s) (both the side faces or only one side face), only on its back surface and a side face(s) (both the side faces or only one side face), or on all the faces thereof (both the front and back surfaces as well as both the side faces). Alternatively, the blackened face 22 may be only blackened but not having the desired micro-irregularities. For instance, while the blackened face 22 can be provided on all the faces of the meshed layer 2 as shown in FIG. 4(D), only the blackened front surface may have desired irregularities prescribed in the present invention.

(Meshed Layer: Probability Density Function of a Contour Curve for the Blackened Surface)

In the present invention, the surface color of the blackened face 22 is black (including achromatic colors with low brightness and gray colors) or a color verging on black (e.g., chromatic colors with low brightness and low saturation, including brown, dark blue, dark green or the like. These colors are considered as "black" herein.). In addition, the blackened face 22 has specially formed micro-irregularities. Namely, the micro-irregularities are defined such that when the surface roughness is employed as a contour curve of a surface of the blackened face, the shape in the vicinity of the peak of the probability density in the probability density function (JIS B0601 (2001 version)) of the contour curve becomes convex upward in a curve (herein, referred to as "a probability density curve") to be obtained by smoothing the probability density function. The term "upward" in "convex upward" means the direction of increase of the probability density when the probability density is expressed as the vertical axis in a graph.

In FIG. 2, FIG. 2(A) shows a roughness curve R as a contour curve, wherein reference character ML designates an averaged line. As the contour curve, a profile curve, roughness curve or waviness curve can be mentioned. However, the roughness curve R obtained by subtracting the waviness curve from the profile curve is employed in the present invention. FIG. 2(B) shows a probability density function ADF (a frequency distribution function for the difference of elevation in the irregularities) of the roughness curve, and a load curve (BAC) (an accumulated frequency distribution curve for the difference of elevation in the irregularities), both of the which are calculated from the contour curve of the roughness curve R in FIG. 2(A). In this drawing, Rp denotes a peak value of the peak in the roughness curve, while Rv designates a bottom value of the deepest valley in the roughness curve. FIG. 2(C) is a graph obtained by rotating FIG. 2(B) by 90 degrees such that the probability density is expressed as the positive vertical axis in the drawing. In FIG. 2(C), the scale between Rp and Rv on the horizontal axis for expressing the height of the contour curve and that on the vertical axis expressing the probability density is an anti-logarithmic scale but not a logarithmic scale.

While the probability density function ADF has a shape of fine irregularities as shown in FIG. 2(C), the probability density curve Adc is formed by smoothing the probability density function ADF as shown in FIG. 1(A). The probability density function ADF which is obtained by measuring a surface becomes a graph including serrated portions like a column graph as shown in FIGS. 2(B) and 2(C), and features of fine irregularities of the measured surface can then be expressed as a probability density curve to be obtained by smoothing the probability density function using the least squares method. The expression of the probability density function as such a curve is theoretically based on an approach of repeating the measurements for a surface infinitely to average and smooth the serrations, thus finally, the resultant averaged probability density function will be a significantly smoothed curve. Therefore, we attempted to approximately obtain such a resultantly smoothed curve from the results of performing the measurement and calculation once or a few times.

As a result, we found that the blackened face having a probability density curve with a shape which is continuously convex upward in the vicinity of the peak of the probability density as shown in FIG. 1(A) can exhibit antireflection effect better than the curve having a shape which is not convex upward but sharply pointed as shown in FIG. 1(B). The term "in the vicinity of the peak" means a range where the width in the direction of the horizontal axis with the peak point $P_1$ centered becomes 5% or greater of (Rp–Rv), preferably 10% or greater where (Rp–Rv) is the difference between the peak value Rp of the peak and the bottom value Rv of the deepest valley of the probability density curve Adc. In addition to the condition that the shape of the provability density curve Adc in the vicinity of the peak should be convex upward, the antireflection effect will be better as the shape of the curve becomes more symmetric in the horizontal axis direction (the difference between the mid point M of Rp and Rv and the height P of the peak in the curve Adc becomes smaller), as described below in one of the present examples shown in FIG. 5(C). To the contrary, as shown in FIG. 5(A), the antireflection effect of the surface tends to be decreased (even though the effect can still be recognized as satisfactory) as the symmetric property in the horizontal axis direction of the probability density curve Adc is decreased (as the height of the peak P is relatively far from the mid point M). In FIGS. 5(D) and 5(E), the symmetric property in the horizontal axis direction of the probability density curve Adc is significantly decreased, and the curve Adc includes portions being convex downward in the vicinity of the peak. Therefore, the antireflection property of the blackened face 22 is markedly degraded and thus unacceptable. The degree of the symmetric property in the horizontal axis direction of the probability density curve Adc can be expressed by (|P–M|/Rp–Rv)×100 (%), where Rp is the height of the peak of the curve, Rv is the depth of the deepest valley of the curve, M is the mid point, and P is the height of the peak point, with 12(%) being preferred as the resultant value. This definition of the surface roughness based on the shape of the curve can evaluate what could not be evaluated by the conventional prescription of the surface roughness based on the arithmetically averaged surface roughness Ra. Namely, we have found that there are both acceptable and unacceptable results in the tested properties even in the test samples having approximately the same surface roughness Ra (see Table 1). Accordingly, the present invention was made in light of this point. As a result, adding to the condition that the averaged surface roughness Ra should be in the range of 0.10 to 1.00 μm, we found that it is preferred to further provide a blackened face having micro-irregularities which can exhibit a particular shape of the probability density curve.

In order to form the surface of the blackened face including desired micro-irregularities defined in the probability density function as described above, the conditions of the blackening treatment may be appropriately adjusted, otherwise the state of the micro-irregularities on the object to be blackened, i.e., the surface to be the underlying face of the blackened face, may be adjusted.

In the case of additionally forming the blackened layer, it is preferred that the underlying face has micro-irregularities rather than being a mirror finished surface because the face having micro-irregularities is formed easier even when it is significantly thin.

As described above, for the micro-irregularities of the blackened face 22 of the meshed layer 2, the probability density curve Adc, expressed by the horizontal axis ranging from the peak value Rp of the peak to the bottom value Rv of the deepest valley and by the vertical axis as the probability density showing the distribution of height, has a peak point $P_1$ which is convex upward (FIG. 1(A)). In addition, the probability density curve is a continuous function in the vicinity of the peak point $P_1$, and has a horizontal tangent $T_1$ at the peak point $P_1$. Preferably, the probability density curve has a range of coordinates of the horizontal axis in the vicinity of the peak point $P_1$, i.e., a width with the peak point $P_1$ centered in the horizontal axis direction, which is |Rp–Rv|×0.05 or greater, more preferably |Rp–Rv|×0.10 or greater, and also has an upwardly convex portion. The term "upwardly convex portion" means that such a curve is always below the tangent.

In the case of a probability density curve of a comparative example shown in FIG. 1(B), the curve has no tangent at its peak point $P_1$.

As shown in FIGS. 5(A), 5(B) and 5(C), it is preferred that the height P at the peak point $P_1$ in the probability density curve Adc expressing each state of micro-irregularities of the blackened face 22 is in the vicinity of the mid point M between Rp and Rv, and |P–M|/Rp–Rv×100≦12.

(Meshed Layer: Meshed Electrically Conductive Layer)

Typically, the meshed electrically conductive layer 21 is formed by etching a metal foil. Other materials may be utilized if their electromagnetic wave shielding ability is significantly applicable. Accordingly, in the present invention, the materials of the meshed electrically conductive layer and the method of forming it are not limited in particular, various meshed electrically conductive layers for publicly known optically transparent electromagnetic wave shielding filters can be advantageously employed. For example, meshed electrically conductive layers formed by utilizing a printing or plating method into an initially meshed form or those formed by first providing an electrically conductive layer on the whole surface of an optically transparent base material using a plating method and then etching the surface of the layer to obtain a meshed surface may be used.

For example, in the case of forming the meshed electrically conductive layer 21 by employing etching, the meshed layer can be obtained by patterning a metal layer laminated on the transparent base material 1 using etching to form openings therein. In order to laminate a metal layer on the transparent base material, a metal layer provided as a metal foil may be laminated on the transparent base material 1 using an adhesive. Otherwise, rather than using an adhesive for lamination, a metal layer may be deposited or layered on the transparent base material utilizing one or two or more of physical or chemical forming approaches, such as vapor deposition, spattering or plating. In the case of the meshed electrically conductive layer formed by etching, this layer may also be formed by directly patterning a metal foil alone before it is laminated on the transparent base material. Such a meshed electrically conductive layer formed from a metal foil alone can then be laminated on the transparent base material using an adhesive or the like means. Among these meshed electrically conductive layers, because of easiness of handling those meshed electrically conductive layers generally having poor mechanical strength, excellent productivity, and availability of marketed metal foils, a laminated meshed electrically conductive layer which is formed by first laminating a metal foil on the transparent base material using an adhesive and then etching the laminated product into a meshed form is the most representative.

While the meshed electrically conductive layer 21 is not limited in particular as long as it has electrical conductivity sufficient for exhibiting a desired electromagnetic wave shielding ability, a metal layer is normally preferred because of its excellent electrical conductivity. As described above, a metal layer can be formed by vapor deposition, plating, lamination of a metal foil or the like approach. As metallic materials for the metal layer or metal foil, for example, gold, silver, copper, iron, nickel, chromium or the like can be mentioned.

An alloy may be used as the material for the metal layer, and the metal layer may be mono-layered or multi-layered. In the case of iron for example, low carbon steel, such as low carbon rimmed steel or low carbon aluminum-killed steel, Ni—Fe alloys, or invar alloys is preferred. In the case of using copper as the metal, copper or copper alloys may be used. As the copper foil, a rolled copper foil or an electrolytically produced copper foil may be used, with the electrolytically produced copper foil being preferred in respect of the thinness, uniformity of thickness, and adhesiveness to the blackened layer.

The thickness of the electrically conductive layer 21 formed of a metal layer is approximately 1 to 100 μm, preferably 5 to 20 μm. If the thickness is below the range, it becomes difficult to obtain a sufficient electromagnetic wave shielding property due to elevation of the electric resistance. To the contrary, if the thickness exceeds the range, it will be difficult to obtain a finely meshed shape and the uniformity of the mesh will be degraded.

It is preferred that the surface of the metal layer to be formed into the meshed electrically conductive layer is rough if enhanced adhesiveness of the metal layer and an adjoining layer such as a transparent adhesive layer for lamination of the metal layer and the adjoining layer is required.

(Meshed Layer: Blackened Layer)

The blackened layer 22 serves to provide a blackened face to the meshed electrically conductive layer. Any suitable layer can be used as the layer 22 as long as it exhibits a significantly dark color such as black and satisfies essential physical properties such as adhesiveness, and any publicly known blackened layers may be used optionally.

Accordingly, as the blackened layer, inorganic materials such as metal or organic materials such as black colored resins can be used. As the inorganic materials, metals, alloys, or metal compounds such as metal oxides and metal sulfides can be employed in a form of a metallic layer. As the method of forming the metallic layer, various publicly known blackening methods may be employed as needed. Especially, the blackening treatment by plating is preferred in respect of adhesiveness, uniformity, easiness or the like factors. As the materials for the plating method, metals or metal compounds, for example, copper, cobalt, nickel, zinc, molybdenum, tin, chromium, can be used. These materials are superior to cadmium in respect of adhesiveness and the degree of blackness.

In the case where the meshed electrically conductive layer 21 is formed of a copper foil or copper, a cathodic electrodeposition is a preferred plating method as the blackening treatment for forming the blackened layer 22. In such a cathodic electrodeposition plating method, the meshed electrically conductive layer formed of copper (or, in the case where this treatment is performed prior to forming the meshed structure, the electrically conductive layer used for the previous step) is subjected to a cathode electrolytic treatment in an electrolytic solution containing sulfuric acid, copper sulfate and cobalt sulfate so as to make cationic particles be deposited onto the surface to be treated. With such a method, a blackened layer as well as a roughened surface can be obtained due to deposition of cationic particles. As the cationic particles, copper particles or copper alloy particles can be used. As the copper alloy particles, copper-cobalt alloy particles are preferred, with the average particle diameter of 0.1 to 1 μm being more preferable. By using such copper-cobalt alloy particles, a blackened layer comprising a copper-cobalt alloy particulate layer can be obtained. The cathodic electrodeposition method is also preferred in that the average particle diameter of the cationic particles to be deposited can be controlled in a range of 0.1 to 1 μm. If the average particle diameter exceeds the above range, the closeness of the deposited particles becomes poor, leading to unevenness and falling of the particles (or powders). If the average particle diameter is below the range, the degree of blackness will be impaired. In the case of the cathodic electrodeposition method, the treatment is performed at a high current density, making the treated surface be cathodic and active due to the production of reductive hydrogen, thus significantly enhancing the adhesiveness between the copper surface and the cationic particles.

As the blackened layer 22, black colored chromium, black colored nickel, nickel alloys are also preferred. As the nickel alloys, nickel-zinc alloys, nickel-tin alloys, and nickel-tin-copper alloys can be used. In particular, nickel alloys are excellent in the degree of blackness and the electric conductivity and also able to provide a anti-corrosive function to the blackened layer (i.e., the blackened layer will also be used as a rustproof layer), thus eliminating the need of an additional anti-corrosive layer. Usually, since the particles of the blackened layer are needle-like, they tend to deform by external force and their appearance are likely to change. In the blackened layer formed of nickel alloys, however, the particles are unlikely to deform, and their appearance are difficult to change after the processing steps. For the method of forming the nickel alloy to be used as the blackened layer, publicly known electrolytic or non-electrolytic plating methods may be used, and the nickel alloy may be formed after performing nickel plating.

(Meshed Layer: Meshed Shape)

While the meshed shape of the meshed layer 2 is not limited in particular, a square shape is representative as the shape of the mesh opening. The shape of the opening, however, may be, for example, polygons including triangles such as equilateral triangles, quadrilaterals such as squares, rectangles, rhombi, trapezoids and hexagons; circles, ellipses or the like, when viewed in a plane view. The mesh has a plurality of openings having such shapes, and line portions each usually having a uniform width are arranged between these openings. Typically, the openings and the portions between these openings have the same shapes and the same sizes, respectively. Specifically, due to the opening ratio and the invisibility of the mesh, the line width is 25 μm or less, preferably 20 μm or less. The size of each opening is defined by (the line interval or line pitch)—(the line width). It is preferred that the line interval or line pitch is 150 μm or greater, preferably 200 μm or greater, in respect of the transmittance of light.

In this case, the bias angle (the angle formed by the line portions of the mesh and the sides of outer periphery of the electromagnetic wave shielding filter) may be suitably selected to avoid a moire pattern in view of the pitch of picture element (pixels) on the display and light emitting properties.

While the meshed layer 2 may have a meshed portion over the whole surface of the electromagnetic wave shielding filter 10, the meshed portion may be provided in some regions for which optical transparency is required, but may not provided in other regions (for example, a frame may surround all four sides of the outer periphery of the meshed portion). Namely, the non-meshed portion is a place other than the meshed portion and corresponds to a region for which optical transparency is not required. Usually, the non-meshed portion is provided to the outer periphery of the meshed portion. Commonly, the non-meshed portion is utilized for grounding.

Usually, the non-meshed portion utilized for grounding is provided in a form of a frame covering all four sides of the outer periphery of the meshed portion. The frame-like non-meshed portion can also be used as an outer frame which surrounds an outer periphery of a display in a form of a frame (for example, as a black colored frame) in contrast to an image to be viewed through the meshed portion so as to make the image look better. In case of grounding the non-meshed portion, it is preferred to expose at least a portion of the non-meshed portion.

While a specific size of the non-meshed portion depends on how to use the non-meshed portion, in the case of using it as an outer frame and for grounding, the width of the frame is approximately 15 to 100 mm, and generally 30 to 40 mm.

(Meshed Layer: Component Layers)

For the meshed layer 2, other layers and/or other treatments may be suitably provided as desired. For example, in the case of insufficient durability against corrosion, a rustproof layer (anti-corrosive layer) 2a may be provided. The rustproof layer 2a, similar to the blackened layer, is also regarded herein as one of the layers which constitute the meshed layer 2 as long as it keeps a meshed form, a geometric feature of the meshed layer 2.

(Meshed Layer: Component Layers (the Rustproof Layer))

The rustproof layer (anti-corrosive layer) 2a may be provided to a portion in which the surface of the meshed layer 2 tends to get rust. However, in the case of further providing the rustproof layer 2a on the blackened face, even after the provision of the rust proof layer 2a on the blackened face (in fact, the face is a rustproof face), at least one of the front and back surfaces should be a face exhibiting an adequate black color as well as having desired micro-irregularities. The meshed layer covered with the rustproof layer may exist only on the front surface, only on the back surface, on both the front and back surfaces, only on side faces (on both sides or one side), on the front surface and both sides, on the back surface and both sides, or on both the front and back surfaces and both sides.

The rustproof layer (anti-corrosive layer) 2a is not limited in particular and may include inorganic materials such as metals, organic materials such as resins, or combinations thereof, as long as it is difficult to get rust as compared with the meshed electrically conductive layer. In certain instances, by covering the blackened layer with the rustproof layer, falling or deformation of particles of the blackened layer can be prevented, thereby enhancing the degree of blackness of the blackened layer. In this respect, in the case where the meshed electrically conductive layer is formed of a metal foil and where the blackened layer is provided by a blackening treatment to the metal foil on the transparent base material, it is preferred that the blackened layer is provided prior to lamination of the transparent base material and the metal foil because of preventing the falling and deformation of the blackened layer particles.

As the rustproof layer 2a, a publicly known one can be employed optionally, and for example, metals such as chromium, zinc, nickel, tin, copper, or a layer of a metal compound such as metal oxides can be mentioned. These layers can be formed by a publicly known method. As one example of a preferred rustproof layer in respect of the rustproof effect and the adhesiveness, a chromium compound layer which is obtained by subjecting a material to zinc plating and then to a chromate treatment can be mentioned.

In the case of chromium, a chromate (a salt of chromic acid) treatment may be used. The chromate treatment is performed by contacting a chromate treating liquid with a surface to be treated. This contact can be achieved by a coating method, such as roll coating, curtain coating, squeeze coating, flowing irrigation (these methods are used for the contact with only one side), and static atomization and dipping can also be used for the contact with both sides. After the conting, the processed material can be directly dried without being washed with water. As the chromate treatment liquid, an aqueous solution containing chromic acid is usually used, and specifically, ALSURF® 1000 (produced by Nippon Paint Co., Ltd.) and PM-284 (produced by Nippon Percarizing Co., Ltd.) can be mentioned.

In respect of the adhesiveness and anti-corrosive effect, it is preferred that zinc plating is performed prior to the chromate treatment. In the rustproof layer, silicon compounds such as silane coupling agents may be contained to enhance acid resistance against etching or acid cleaning.

The thickness of the rustproof layer is usually in a range of about 0.001 to 10 μm, and preferably 0.01 to 1 μm.

(Transparent Resin Layer)

As shown in FIG. 3(A), the transparent resin layer 3 is provided as required by covering the surface irregularities of the meshed layer 2 with a transparent resin and flattening the surface on the meshed layer side so as to prevent incorporation of bubbles when an attachment article is laminated on the meshed side surface using an adhesive or protect the meshed layer from external force. In respect of the protection, the transparent resin layer also serves as a protective layer for the corresponding surface. This transparent resin layer 3 is formed on the irregular surface of the meshed layer 2 laminated on the transparent base material 1, by a method, such as by coating a liquid composition containing a resin. As the liquid composition, any suitable material can be used without any particular limitation as long as it contains a transparent resin, and a publicly known resin can be used optionally. For example, thermoplastic resins, thermosetting resins or ionizing radiation curable resins can be employed. For example, the thermoplastic resins include acryl-type resins, polyester resins, thermoplastic urethane resins, vinyl acetate-type resins or the like. The thermosetting resins include urethane resins, epoxy resins, curable acryl resins or the like. The ionizing radiation curable resins include acrylate-type resins which are curable with ultraviolet rays or ionizing radiations. Especially, in view of easiness of covering and filling the irregularities of the meshed layer, the ionizing radiation curable resins are preferred because they can be coated in a non-solvent or nearly non-solvent state.

While it is sufficient for the purpose of flattening that the transparent resin layer 3 can fill only the openings of the meshed layer, the layer 3 may also cover the area right over the line portions of the meshed layer as shown in FIG. 3(A). When the transparent resin layer is also provided over the line portions, and when the surface of the meshed layer contacting with the transparent resin layer is a blackened face, the color changes into a wetted color due to an optical effect of the transparent resin layer. However, in accordance with the present invention, even in the case of such a wetted color, a significantly high antireflection effect can be ensured, thus making the construction in which the transparent resin layer is also provided right over the line portions be an appropriate one.

(Other Layers: Attachment Articles, Optical Filter Layers, Surface Protective Layers, Transparent Adhesives or the Like)

The term "attachment articles" means, for example, optical filter layers (films, sheets or plates) or surface protective layers (films, sheets or plates). The filtering function of the optical filter layers includes absorption of near infrared spectra, antireflection of ambient light (including anti-glaring), color adjustment (absorption of neon light or enhancement of color reproducibility), absorption of ultraviolet rays or the like. The function of the surface protective layers includes contamination prevention, hard coating or the like. Any publicly known means can be used optionally to perform these functions. Such an optical filter layer or surface protective layer may also be coated on the meshed layer or transparent resin layer, rather than attached thereto. Especially, in the case of the optical filter layer, one optical filter layer with functions similar to those above may be formed on another optical layer.

To the contrary, in the construction having the meshed layer formed on the transparent base material, the attachment article may be laminated on the side of the transparent base material. When there is no adhesiveness between the attachment article and the transparent base material, the lamination may be carried out via a suitable transparent adhesive layer. The transparent base material and the meshed layer may also be laminated by using a suitable transparent adhesive layer therebetween. As the transparent adhesive layer, adhesives having a low adhesiveness, or publicly known adhesives such as cohesive agents or the like may be used. In addition, the attachment article may be laminated on both the front and back surfaces of the electromagnetic wave shielding filter for use in a display. In such a case, the sorts (or functions) of the attachment articles can be individually selected on each of the front and back surfaces.

(Others)

In the resins each used for the transparent base material, transparent resin layer, transparent adhesive layer or attachment article and constituting the electromagnetic wave shielding filter, dyes for antireflection of ambient light, absorbents of neon light, dyes for color adjustment, or other dyes publicly known in the art of the electromagnetic wave shielding filter can be added as needed.

FIG. 3 illustrating details of the meshed layer and FIG. 4 illustrating the blackened face are provided herein for explaining each present example corresponding to each specific construction. Of course, these constructions may be suitably employed in combination with one another. Also, it is should be noted that the present invention is not limited to the drawings as well as to the present examples described below.

EXAMPLES

Hereinafter, the present invention will be described in more detail with reference to the present examples and comparative examples.

Example 1

First, as the transparent base material 1, a continuous belt-like laminated sheet was made by dry lamination of an electrolytically produced copper foil with a thickness of 10 μm on the front face of a continuous belt-like non-colored and transparent biaxially oriented polyethylene terephthalate film (with a thickness of 100 μm) using a two-part curable urethane resin-type adhesive.

Next, the laminated sheet was subjected to etching utilizing the photolithography to form a meshed pattern, thereby obtaining a meshed laminated sheet where the meshed electrically conductive layer 21 is formed on the transparent base material 1.

Subsequently, the surface on the side of the meshed electrically conductive layer of the meshed laminated sheet was subjected to a blackening treatment employing the black-colored nickel plating in order to form the blackened layer 22. Thus, the electromagnetic wave shielding filter 10 as shown in FIG. 3(B) was made first, which has a blackened surface including desired micro-irregularities due to the blackened layer on the surface (and both side faces) of the meshed layer 2. In respect of the shape of the mesh formed, each opening was of a square shape, with the line width of each line portion being 25 μm, and with the line pitch being 150 μm. All four sides of the outer periphery of the meshed portion remained as a frame-like non-meshed portion.

In addition, the surface on the meshed layer side of the produced electromagnetic wave shielding filter 10 was coated with an acryl resin-type coating liquid as a transparent resin layer 3, which could also be used as an adhesive layer, by the intermittent die coating method so as to coat the meshed layer such that the non-meshed portion was partly exposed but an inner periphery thereof was fully coated. Next, on the coated film after drying the solvent of the coating liquid, an antireflection film employing a triacetyl cellulose film as a base material was laminated as an attachment article, and thus producing a desired electromagnetic wave shielding filter having an antireflection function.

Examples 2 and 3

Except for changing the electrolytically produced copper foil, electromagnetic wave shielding filters were made in the same manner as in Example 1, respectively.

Comparative Examples 1 and 2

Except for changing the electrolytically produced copper foil, electromagnetic wave shielding filters were made in the same manner as in Example 1, respectively.

(Evaluation of Performance)

The results of evaluating the properties and performance of each blackened face for the electromagnetic wave shielding filters of the aforementioned Examples and Comparative Examples are provided in Table. 1.

The evaluation of properties of the blackened face was done for each blackened face on the surface of the non-meshed portion around the outer periphery of the meshed layer. Also, the evaluation of the antireflection property was conducted for each non-meshed portion (i.e., an inner periphery where an antireflection film is laminated via the transparent resin layer so that this portion exhibits a wetted color), such that the influence due to the openings of the meshed portion could be eliminated.

The properties of the blackened face were evaluated based on the probability density curve Adc to be obtained by flattening the probability density function of a roughness curve. In addition to this factor, the arithmetically averaged surface roughness Ra which was the object of evaluation of the prior art, the ten-points averaged roughness Rz (JIS) of a roughness curve, the peak-valley averaged gap Sm (JIS B0601 (1994 version): the averaged gap of irregularities) of a roughness curve, and the deviation from the axis of symmetry in the horizontal direction of the probability density curve (|P−M|/Rp−Rv)×100(%) are also provided in FIG. 1. Also, in FIGS. 5(A) to 5(E), the probability density curves and probability density functions of the respective Examples and Comparative Examples are shown. In each of the Examples, the probability density curve exhibits a continuous curve which is convex upward in the vicinity of the peak, while it is not exhibited in the Comparative Examples. Furthermore, in either of the Examples, the deviation from the axis of horizontal symmetry of the probability density curve is significantly small, for example, lower than 7.12%, while in either of the Comparative Examples, the value is rather high, for example, larger than 16.7%.

The evaluation of the performance was conducted by evaluating the intensity (Y) of light reflection both by directly measuring the intensity (designated as "$Y_{BL}$" in the table) of the blackened face alone without the transparent resin layer and by measuring the intensity (designated as "$Y_{BL+AR}$" in the table) of the portion which exhibited a wetted color after the lamination of the transparent resin layer and a reflective film. In addition, the rate of change (designated as "$Y_{BL+AR}/Y_{BL}$" in the table) of the intensity of reflection for the portion which exhibited a wetted color was also evaluated.

The intensity of light reflection was evaluated in the SCI (Specular Component Included) mode in which the measurement was conducted in accordance with JIS Z8722. Namely, in this evaluation mode, a test piece was first irradiated by a predetermined light source, and both the specular component and the diffuse reflection component of the reflected light were then measured, and finally the two components were added together to determine the total of reflection components. Specifically, a spectrocolorimeter (CM-3600d, produced by Conica-Minolta Sensing Co., Ltd.) was set in a reflective mode. Then, the light source was set at predetermined standard light (D65) and an angle of visibility (2°), and the detector was then set in the SCI mode to measure and evaluate the Y value (lightness).

As shown in Table 1, each of the Examples, as compared with the comparative examples, exhibited significantly lower intensity of light reflection in both the cases of directly measuring the blackened face alone without the transparent resin layer ($Y_{BL}$) and of measuring the portion which exhibited a wetted color and including a light reflective film and the transparent resin layer thereon ($Y_{BL+AR}$), thus providing a more excellent antireflection property. The arithmetically averaged surface roughness Ra in both of the Examples and Comparative Examples is in a range of 0.2 to 1.0 μm, which has been recognized to be acceptable in the conventional art. In fact, the difference in shapes of the probability density curves made it apparent that there is a significant difference in the performance between these Examples and Comparative Examples. Additionally, in the comparison including the measurement results for the portion which exhibited a wetted color, the difference between the Examples and Comparative Examples (the ratio of intensity of light reflection) is further increased. For the rate of change of the intensity of light reflection of the portion which exhibited a wetted color, the result of Example 3 is 0.18 (times), which is significantly large as compared to the others, distinctly showing substantial enhancement of the antireflection effect due to exhibiting a wetted color.

The invention claimed is:

1. An electromagnetic wave shielding filter, comprising:
   a meshed layer formed of a meshed electrically conductive material;
   wherein a blackened face having micro-irregularities is formed on at least one face of the meshed layer; and
   wherein the shape of the micro-irregularities of the blackened face is adjusted to have a probability density curve in which a peak point is convex upward and a horizontal tangent can be drawn at the peak point, the probability density curve being defined as a curve depicted in a graph in which the change of height from the peak value Rp to the bottom value Rv of the micro-irregularities is

TABLE 1

Results of evaluation of the blackened face, properties and performance

| | Shape of the probability density curve | Ra (μm) | RzJIS (μm) | Sm (μm) | $\frac{\|P-M\|}{Rp-Rv} \times 100(\%)$ | $Y_{BL}$ | $Y_{BL+AR}$ | $\frac{Y_{BL+AR}}{Y_{BL}}$ |
|---|---|---|---|---|---|---|---|---|
| | | | | | | Intensity (Y) of light reflection | | |
| | | | | | Deviation from the axis of symmetry in the horizontal direction | | | |
| Example 1 | OK(FIG.5(A)) | 0.96 | 4.53 | 14.8 | 7.12 | 7.0 | 2.5 | 0.36 |
| Example 2 | OK(FIG. 5(B)) | 0.92 | 4.57 | 11.5 | 3.57 | 7.4 | 2.2 | 0.30 |
| Example 3 | OK(FIG. 5(C)) | 0.50 | 2.36 | 13.7 | 2.38 | 9.9 | 1.8 | 0.18 |
| Comparative Example 1 | NG(FIG. 5(D)) | 0.22 | 1.15 | 9.44 | 31.0 | 14.5 | 5.1 | 0.35 |
| Comparative Example 2 | NG(FIG. 5(E)) | 0.43 | 1.80 | 16.8 | 16.7 | 15.8 | 5.9 | 0.37 |

OK: The shape satisfies the conditions of the present invention.
NG: The shape does not satisfy the conditions of the present invention.

shown as the horizontal axis while the probability density expressing the distribution of height is shown as the vertical axis.

2. The electromagnetic wave shielding filter according to claim 1, wherein the meshed layer is supported by a transparent base material.

3. The electromagnetic wave shielding filter according to claim 2, wherein a transparent resin layer is provided on the meshed layer.

4. The electromagnetic wave shielding filter according to claim 2, wherein the blackened face is formed on the face of the meshed layer on the side of the transparent base material as well as on the face thereof on the side opposite to the transparent base material.

5. The electromagnetic wave shielding filter according to claim 1, wherein the blackened face is also formed on one or both side faces of the meshed layer.

6. The electromagnetic wave shielding filter according to claim 1, wherein the probability density curve for the micro-irregularities has a height P at the peak point in the vicinity of an intermediate height M between Rp and Rv.

7. The electromagnetic wave shielding filter according to claim 6, wherein the probability density curve for the micro-irregularities satisfies $(|P-M|/Rp-Rv) \times 100 \leq 12$.

8. The electromagnetic wave shielding filter according to claim 1, wherein the averaged surface roughness Ra of the micro-irregularities is in a range of 0.10 to 1.00 μm.

* * * * *